United States Patent [19]

Itoh

[11] Patent Number: 5,781,415
[45] Date of Patent: Jul. 14, 1998

[54] SEMICONDUCTOR PACKAGE AND MOUNTING METHOD

[75] Inventor: Nobuyuki Itoh, Tokyo, Japan

[73] Assignee: NEC Corporation, Japan

[21] Appl. No.: 677,642

[22] Filed: Jul. 9, 1996

[30] Foreign Application Priority Data

Aug. 10, 1995 [JP] Japan ................................. 7-204672

[51] Int. Cl.⁶ .......................................... H01L 25/00
[52] U.S. Cl. ...................... 361/790; 361/735; 361/792; 361/777; 361/803; 361/783; 361/772; 257/697; 257/704; 257/693; 439/65; 439/75; 439/83; 174/52.6; 174/52.5; 174/50.51; 437/206; 437/247; 437/209; 437/211; 437/220; 437/8; 437/215
[58] Field of Search ...................... 361/790, 735, 361/792, 777, 803, 783, 772; 257/697, 704, 693; 437/206, 247, 209, 211, 220, 8, 215; 439/65, 75, 83; 174/52.6, 52.5, 50.51

[56] References Cited

U.S. PATENT DOCUMENTS 4,791,075  12/1988  Lin ............................................ 437/209
5,446,313  8/1995   Masuda et al. ........................ 257/666
5,594,275  1/1997   Kwon et al. ........................... 257/686
5,613,033  3/1997   Swamy et al. ......................... 361/790

FOREIGN PATENT DOCUMENTS

61-107675  5/1986  Japan .

*Primary Examiner*—Leo P. Picard
*Assistant Examiner*—David Foster
*Attorney, Agent, or Firm*—Hayes, Soloway, Hennessey, Grossman & Hage, P.C.

[57] ABSTRACT

A semiconductor package is described which is constructed from a rectangular tape film, a wiring pattern formed on the tape film constituted by wiring composed of a conductive material, a semiconductor chip electrically connected to one end of the wiring pattern, and holes formed on the other end of the wiring pattern for connection by insertion of lead-pins. A method is then described for stacking and mounting a plurality of semiconductor packages on a wiring substrate by first vertically positioning lead-pins on a wiring substrate and then passing these lead-pins through the holes in the semiconductor packages.

10 Claims, 7 Drawing Sheets

SEMICONDUCTOR PACKAGE AND MOUNTING METHOD

BACKGROUND OF THE INVENTION

1. Field of the Invention

The present invention relates to a semiconductor package and a method of mounting the package, and particularly to a semiconductor package that enables higher integration of a substrate by stacking and mounting a plurality of devices having for example, the same memory bus line.

2. Description of the Related Art

Mounting of, for example. LSI circuit elements on a printed board has conventionally involved mounting packages such as QFP and PGA on the same plane. thereby leading to system complexity as well as increases in the substrate surface area.

However, a variety of semiconductor packages and packaging methods have been developed to meet the growing demand in recent years for higher integration of semiconductor integrated circuits as well as higher integration of substrates. Because semiconductor packages are generally low in height compared to their surface size. higher substrate integration can be achieved through stacking and mounting of semiconductor packages.

Japanese Patent Laid-open No. 107675/86 discloses one example of a method of stacking and mounting of semiconductor packages.

Figure 1:
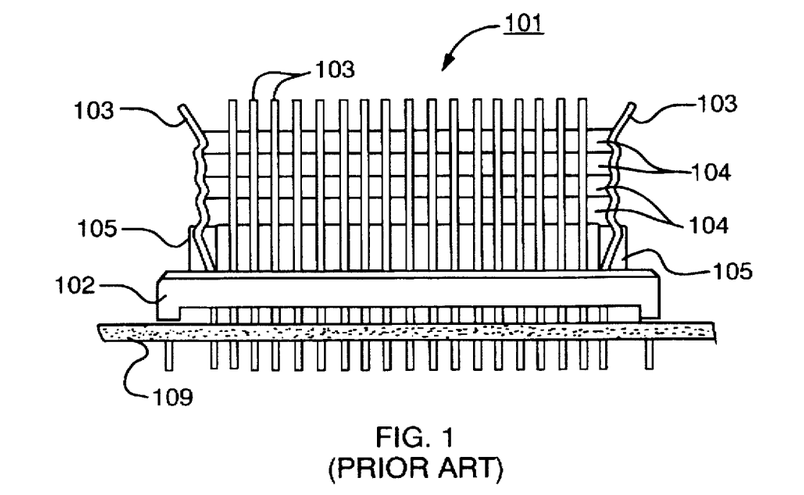
FIG. 1 shows an example of the prior art disclosed in Japanese Patent Laid-open No. 107675/ 86 in which semiconductor packages are stacked and mounted.
Figure 2:
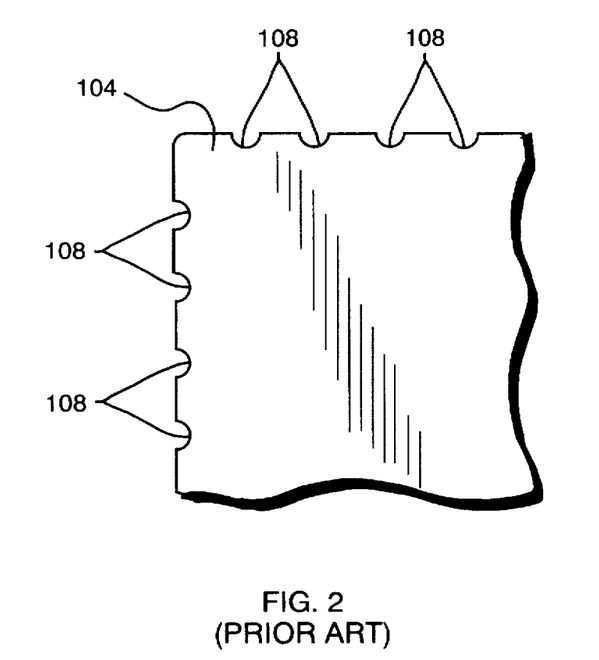
FIG. 2 shows an example of the prior art disclosed in Japanese Patent Laid-open No. 107675/ 86 in which semiconductor packages are stacked and mounted.

FIG. 1 and FIG. 2 illustrate the prior-art example disclosed in Japanese Patent Laid-open No. 107675/86 in which semiconductor packages are stacked and mounted. In these figures, leadless chip carriers 104, which are the semiconductor packages, are stacked and mounted using a stacking pin frame 101

As shown in FIG. 2, a leadless chip carrier 104 is provided with a multiplicity of electrodes 108 formed as semicircular indentations in the edges of the rectangular package. Stacking pin frame 101 is provided with guideposts 105 on its upper surface for positioning the four corners of leadless chip carrier 104, and a frame 102 which vertically supports a plurality of flexible connection pins 103 corresponding to electrodes 108 of a leadless chip carrier 104 which is in turn positioned by guideposts 105.

With this type of stacking pin frame 101, a plurality of leadless chip carriers 104 can be supported and electrically connected to connection pins 103 by inserting leadless chip carriers 104 from above so as to be surrounded by the multiplicity of connection pins 103 with each connection pin 103 fitting into an electrode 108. Then, by inserting connection pins 103 protruding below frame 102 of this stacking pin frame 101 into the through-holes of printed wiring board 109, a plurality of leadless chip carriers 104 can be stacked and mounted on printed wiring board 109.

However, the above-described method for stacking and mounting leadless chip carriers requires the use of a stacking pin frame having greater planar area and thickness than the devices, thereby requiring extra space above the wiring board on which chip carriers are to be mounted.

In addition, mounting is effected by inserting each of the multiplicity of flexible connection pins into an electrode to establish electrical connection with a device, and this connection method is inferior in terms of connection reliability compared with, for example, a soldering method.

Furthermore, because devices are inserted between flexible pins in this method, mounting a semiconductor package employing a material such as tape film is complicated by the factor of strength of the tape film.

SUMMARY OF THE INVENTION

The object of the present invention is to provide a semiconductor package and a semiconductor package mounting method that employ stacking and mounting for higher integration of a substrate that reduce space in the vertical direction of the mounting substrate and that both ensure electrical connection and flexible accommodation of stress during mounting.

To achieve the above-described objects, the present invention is characterized in that, in a semiconductor package having a wiring pattern of a conductive material on a tape film, a portion for connection with a chip is provided on one side of the wiring pattern, holes for insertion of leads are provided on the other side of the wiring pattern, and electrical connection with the outside is achieved by way of leads.

In the above-described semiconductor package, both sides excepting the holes are preferably insulated.

In addition, a semiconductor package is preferably provided with a plastic guard ring on the outer edge of the tape film for protection of the stacked and mounted semiconductor package and for stability between upper and lower devices, and moreover, a semiconductor package is preferably provided with projections and indentations on the upper and lower surfaces of the guard ring which mesh when stacking the semiconductor package.

The present invention is characterized in that, in stacking and mounting any of the above-described semiconductor packages on a wiring substrate, lead-pins for connection to the wiring substrate are first positioned vertically, and a plurality of semiconductor packages are then stacked and mounted on the wiring substrate by inserting the lead-pins into the holes of the semiconductor packages.

In addition, the present invention may also be a method in which lead-pins are attached to a cover cap, and a plurality of semiconductor packages are then stacked and mounted onto a wiring substrate by passing the lead-pins through the holes of the semiconductor packages by inserting from above.

A semiconductor package according to the present invention has a wiring pattern constituted from conductive material on a tape film, and is provided with a portion on one side of the wiring pattern for connection with a chip and with holes on the other side of the wiring pattern for lead insertion. Such a semiconductor package is stacked and mounted on a wiring substrate by first vertically positioning lead-pins for connection in the wiring substrate and then inserting the lead-pins into the holes of the semiconductor package, or by attaching the lead-pins to a cover cap and passing the lead-pins through the holes of the semiconductor package by insertion from above.

In addition, because a semiconductor package according to the present invention is constituted from tape film, the resulting package is thin, exhibits excellent heat discharge characteristics, and moreover, possesses flexibility; and particularly in regard to devices having, for example, the same memory bus line, when stacking and mounting on a wiring substrate, space in the vertical direction of the mounting substrate is reduced, and stress during mounting due to such factors as warping of the wiring substrate can be flexibly accommodated.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Configurations of embodiments of the present invention will next be explained with reference to the accompanying figures.

First Embodiment

Figure 3:
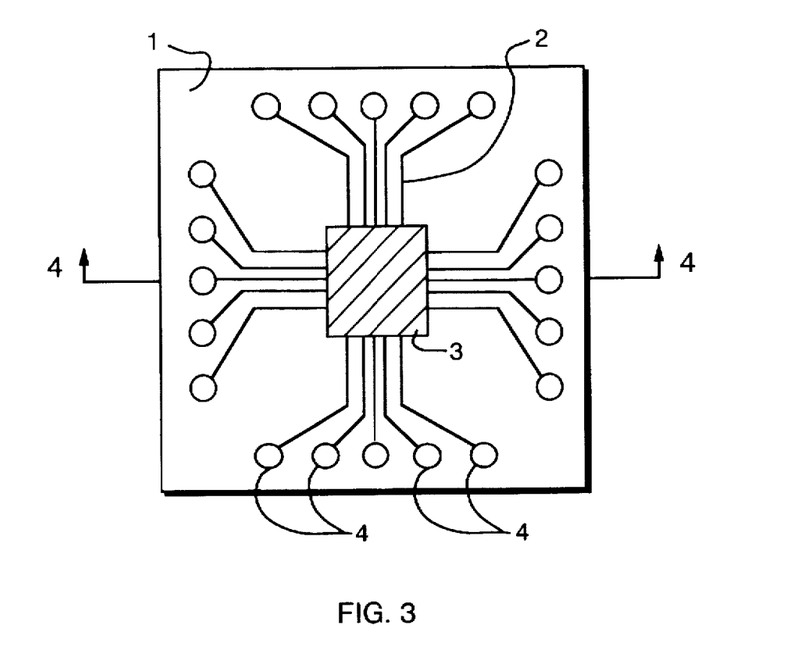
FIG. 3 is a plane view showing the first embodiment of a semiconductor package according to the present invention.
Figure 4:
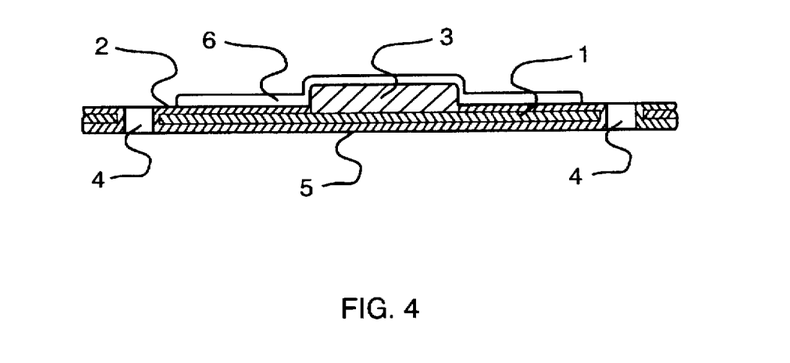
FIG. 4 is a sectional view taken along line 4—4 of FIG. 3.
Figure 5:
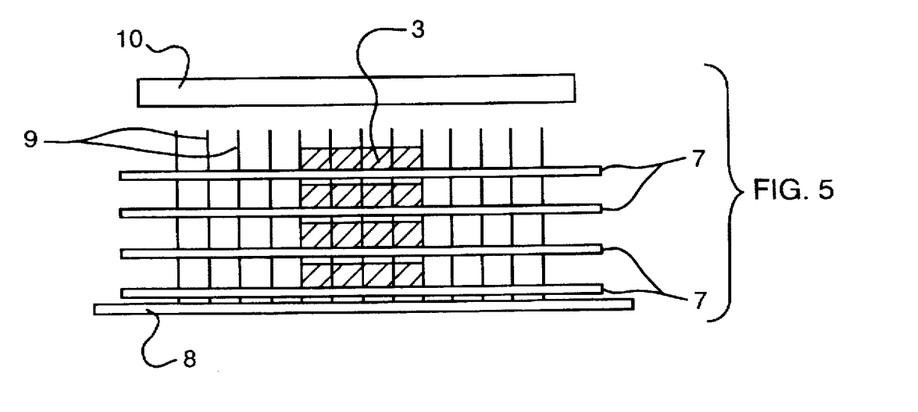
FIG. 5 is a sectional view showing semiconductor packages shown in FIG. 3 stacked and mounted on a substrate.
Figure 6:
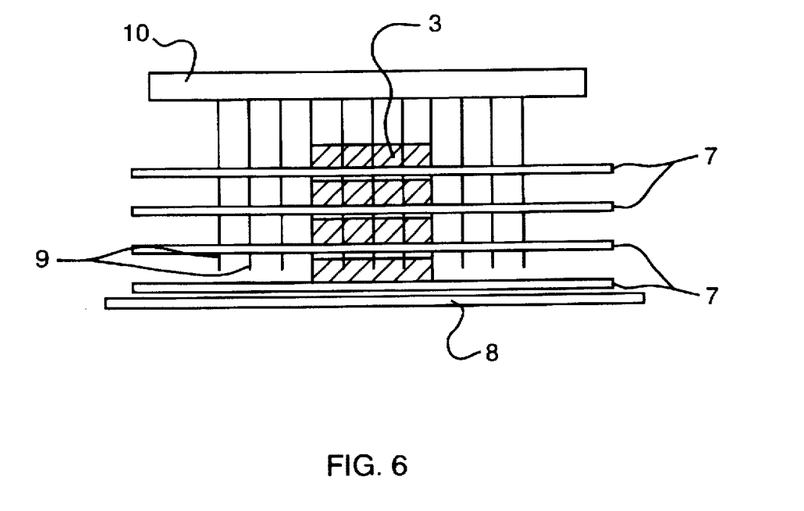
FIG. 6 is a sectional view showing semiconductor packages shown in FIG. 3 stacked and mounted on a substrate.

FIG. 3 is a plan view showing the first embodiment of an semiconductor package according to the present invention. FIG. 4 is a sectional view taken along line 4—4 of FIG. 3, and FIGS. 5 and 6 are sectional views showing the semiconductor package shown in FIG. 3 stacked and mounted on a substrate.

As shown in FIG. 3, this configuration of a semiconductor package is constructed from rectangular tape film 1, wiring pattern 2 formed on tape film 1 and constituted by wiring composed of a conductive material, semiconductor chip 3 which is electrically connected to one end of wiring pattern 2, and holes 4 formed at the other end of wiring pattern 2 for inserting and connecting lead-pins (to be explained).

Holes 4 for lead-pin insertion are aligned in a row along the outer edge of tape film 1. As shown in FIG. 4, the obverse and reverse surfaces of the semiconductor package excluding the vicinities of lead-pin insertion holes 4 are insulated by a resist 5 to prevent short-circuiting at the time of stacking and mounting. A resin coating 6 is applied to the obverse surface portion of semiconductor chip 3.

The above-described semiconductor chip 3 may also be arranged face down and electrically connected to wiring pattern 2 on film 1 by, for example, solder bumps. As shown in FIG. 5, stacking and mounting of this type of semiconductor package may be effected by first vertically positioning lead-pins 9 for connecting together semiconductor packages on wiring substrate 8 and then passing lead-pins 9 through holes 4 of semiconductor package 7. Here, lead-pins 9 and holes 4 may be connected by soldering, and for this method, soldering may be effected by laser irradiation to overcome difficulties imposed by normal solder reflow. Lead-pins 9 protrude above the uppermost portion of the group of stacked and mounted semiconductor packages 7, and cover cap 10 is therefore used to protect and secure the lead-pins 9 against shifting in a horizontal direction.

Alternatively, instead of first vertically positioning lead-pins 9 in wiring substrate 8 as shown in FIG. 5, lead-pins 9 may be attached to cover cap 10 as shown in FIG. 6, and then, with semiconductor packages 7 in a stacked state, the lead-pins are directed from above through holes 4 and inserted into wiring substrate 8.

According to the above-described example, for devices having, for example, the same memory bus line, identical signal lines can be used in common when devices are stacked and mounted and higher integration of a substrate realized by setting address lines, data lines, chip select signal lines and regions at a plurality of holes for connecting packages together, and operating by inputting a chip select signal, and decoding to access each of the devices. In addition, because the configuration of the pattern of each signal line on the wiring substrate can be simplified, inductance of the wiring pattern on the substrate can also be reduced.

Furthermore, this invention allows stacking and mounting of semiconductor packages made from tape film, which are thinner packages that further exhibit superior heat discharge characteristics compared with semiconductor packages such as leadless chip carriers produced using a plastic mold. Because the thickness of a plastic leadless chip carrier is generally about 2 mm, and a package using tape film as a material is less than 1 mm, simple calculation shows that the space in the vertical direction of the mounting substrate can be cut by as much as 50%. Regarding heat discharge as well, an improvement on the order of 20% can be expected because the semiconductor package is not constructed with the entire semiconductor chip buried. In addition, the pliancy of tape film allows flexible accommodation of deformation such as warping of a mounting substrate.

Second Embodiment

Figure 7:
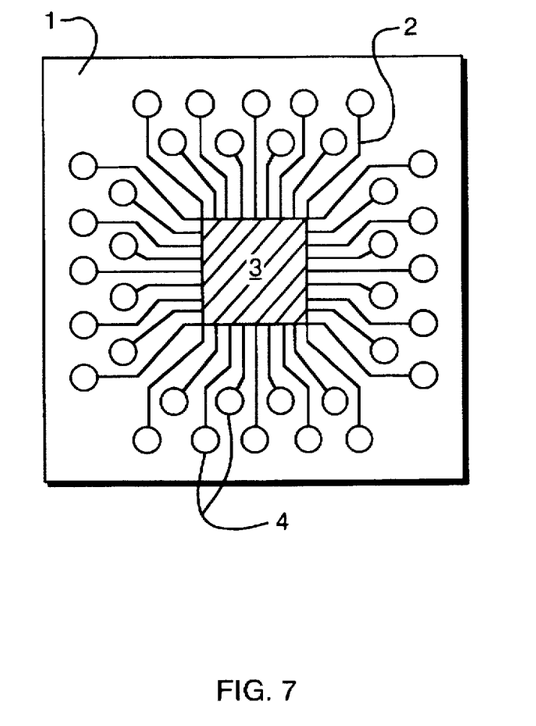
FIG. 7 is a plan view showing a second embodiment of a semiconductor package according to the present invention.

FIG. 7 is a plan view showing a semiconductor package according to the second embodiment of the present invention. In this figure, constituent elements equivalent to those of the first embodiment are identified by the same reference numerals.

As shown in FIG. 7, holes 4 for lead-pin insertion in the semiconductor package according to this embodiment are disposed in a plurality of rows along the outer edge portion of tape film 1. This embodiment can obtain the same effect as the first embodiment, and moreover, can realize a package having numerous pins.

Third Embodiment

Figure 8:
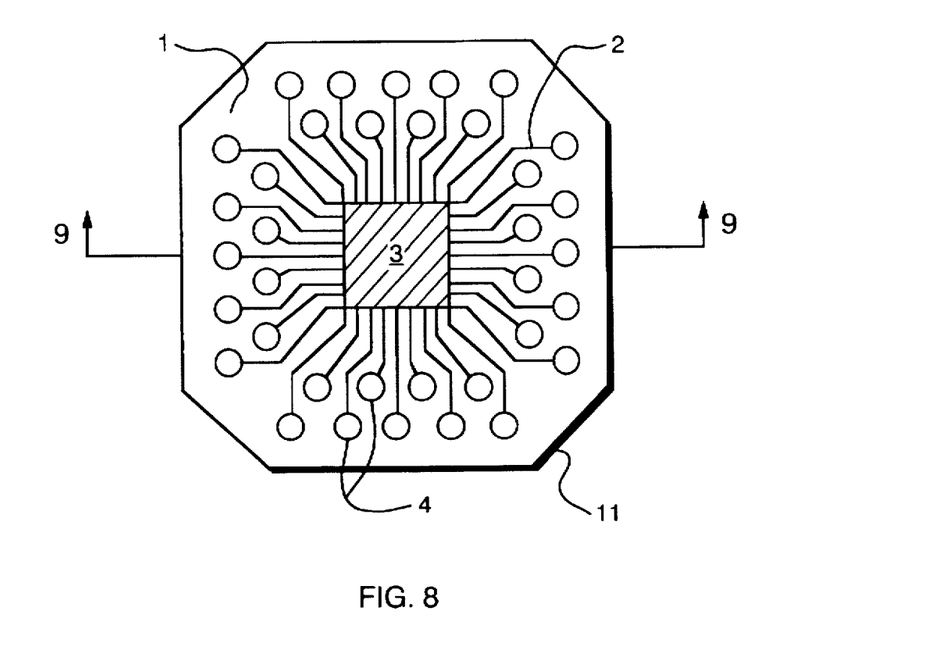
FIG. 8 is a plan view showing a third embodiment of a semiconductor package according to the present invention.
Figure 9:
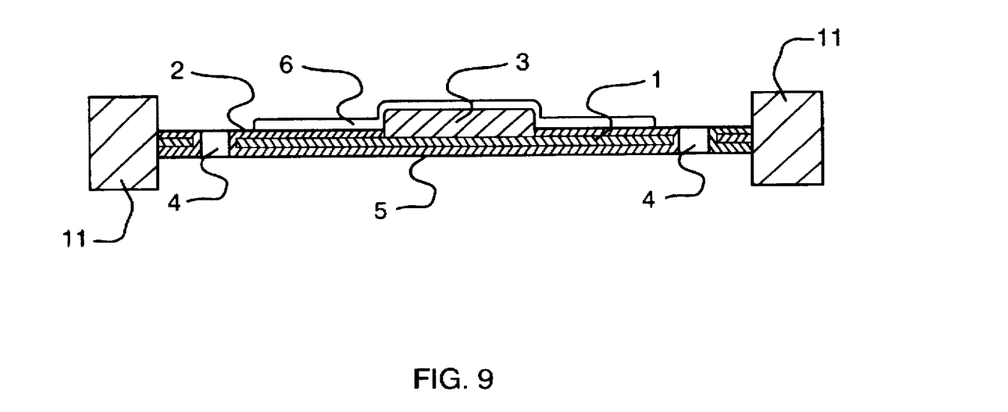
FIG. 9 is a sectional view taken along line 9—9 of FIG. 8.
Figure 10:
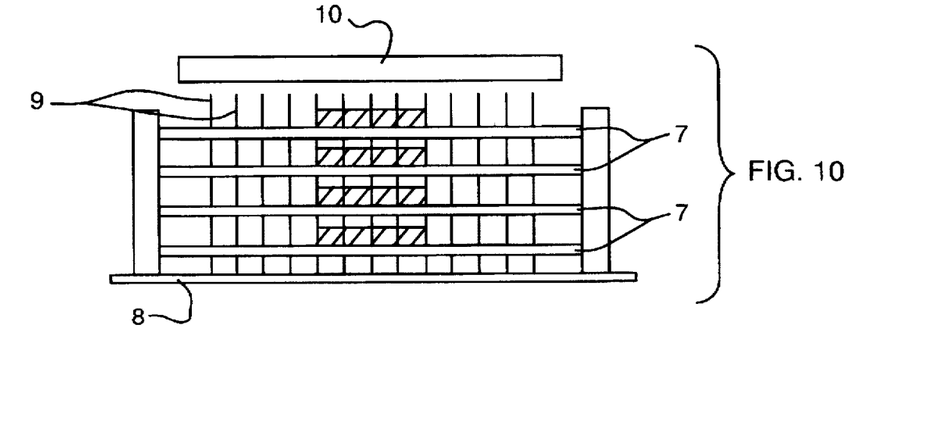
FIG. 10 is a sectional view showing stacking and mounting of the semiconductor package shown in FIG. 8.
Figure 11:
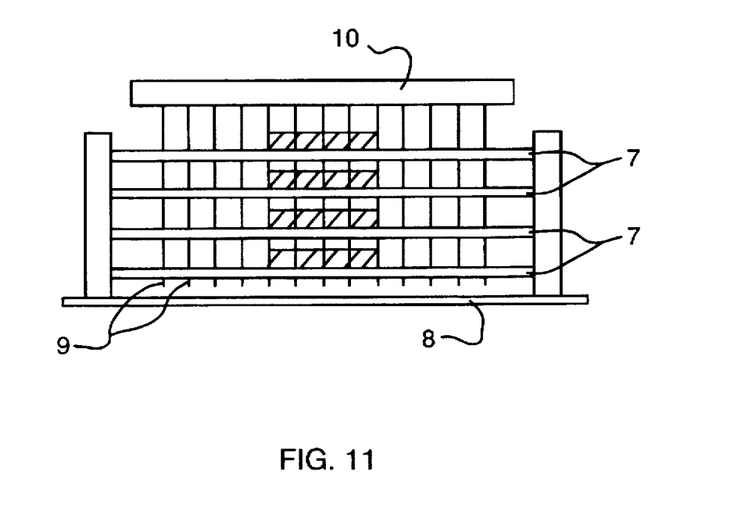
FIG. 11 is a sectional view showing stacking and mounting of the semiconductor package shown in FIG. 8.

FIG. 8 is a plan view showing the third embodiment of a semiconductor package according to the present invention. FIG. 9 is a sectional view taken along line 9—9 of FIG. 8, and FIGS. 10 and 11 are sectional views showing examples of stacking and mounting of semiconductor packages shown in FIG. 8. In these figures, constituent elements that are equivalent to those of the first embodiment are identified with the same reference numerals.

As shown in FIGS. 8 and 9, a semiconductor package according to this embodiment includes a plastic guard ring 11 at the outer edge portion of tape film 1 of the semiconductor packages of the first and second embodiments. Guard ring 11 slightly augments the thickness of the package units in order to provide insulation between devices.

The guard ring may be connected to the outer edge portion of the tape film by a variety of methods. For example, the tape film may be attached to the guard ring by splitting the guard ring into upper and lower sections and sandwiching the tape film between the two sections.

As shown in FIGS. 10 and 11, when semiconductor packages of this type are stacked and mounted, lead-pins 9 for connecting together the semiconductor packages may first be vertically positioned on wiring substrate 8 and the lead-pins 9 then passed through holes 4 of the semiconductor packages 7.

Upon stacking, the guard rings 11 of upper and lower semiconductor packages 7 contact each other and secure the positions of the semiconductor packages 7.

In addition to exhibiting the same effects as the semiconductor package according to the first and second embodiments, this embodiment includes a guard ring that reinforces the strength of stacked and mounted semiconductor packages and ensures stability of the relative positions of upper and lower devices.

Fourth Embodiment

Figure 12:
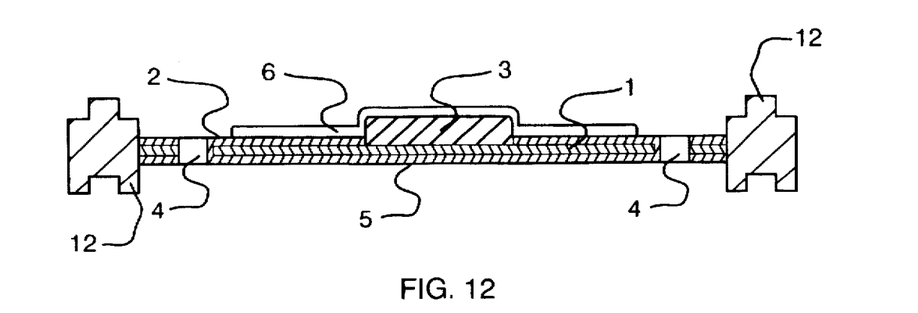
FIG. 12 is longitudinal sectional view showing a fourth embodiment of a semiconductor package according to the present invention.
Figure 13:
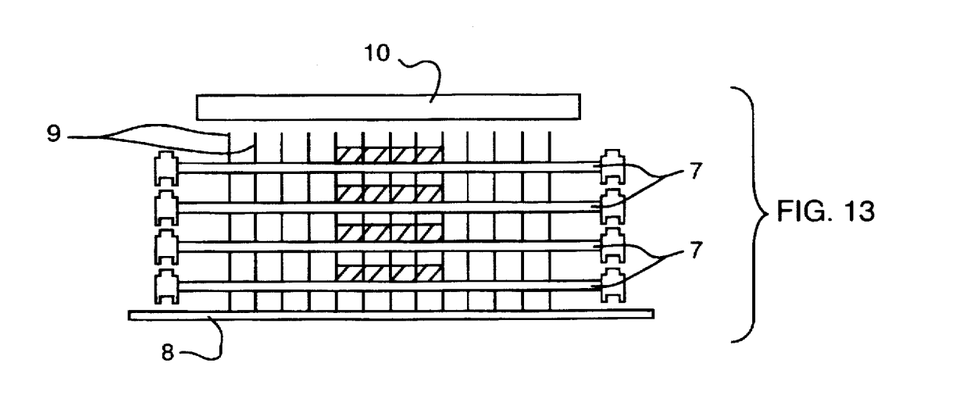
FIG. 13 is a sectional view showing stacking and mounting of the semiconductor package shown in FIG. 12.
Figure 14:
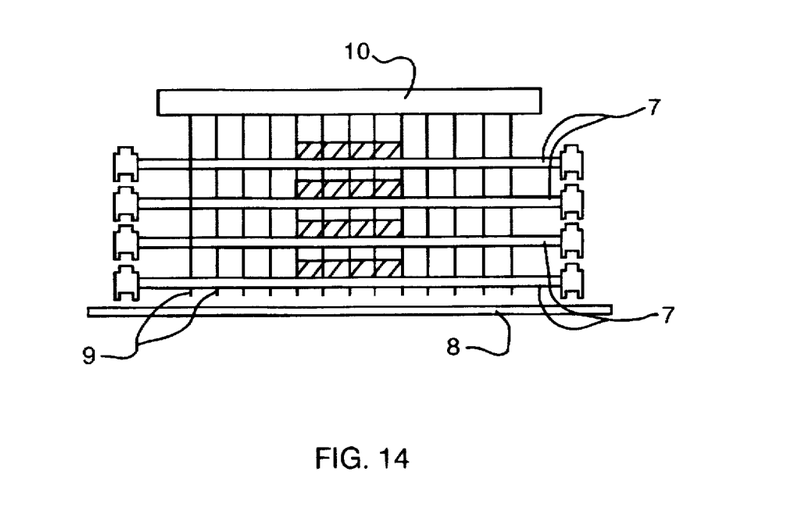
FIG. 14 is a sectional view showing stacking and mounting of the semiconductor package shown in FIG. 12.

FIG. 12 is a longitudinal section showing the fourth embodiment of a semiconductor package according to the present invention, and FIGS. 13 and 14 are sectional views showing examples of stacking and mounting of semiconductor packages shown in FIG. 12. In these figures, constituent elements equivalent to those of the first embodiment are identified with the same reference numerals.

As shown in FIG. 12, in the semiconductor package of this modification, guard ring 12 is provided with a projection and indentation on the upper and lower surfaces, respectively, and is attached to the outer edge portion of tape film 1. In stacking and mounting, meshing the projection with the indentation as shown in FIGS. 13 and 14 allows secure positioning in the horizontal direction, and moreover, clearly distinguishes the obverse from the reverse of the packages, thereby reducing the danger of errors in mounting.

As explained in the foregoing description, the present invention enables higher integration of a substrate by providing a semiconductor package having a wiring pattern constituted by conductive material on a tape film with a portion for connection with a chip on one side of the wiring pattern and holes for insertion of leads on the other side, whereby, for devices having, for example, the same memory bus line, the leads can be used to stack and electrically connect a plurality of devices. Moreover, because the package is constituted by tape film, the semiconductor package is thinner, exhibits excellent heat discharge characteristics, and possesses flexibility, and as a result, when stacking and mounting on a wiring substrate, space in a direction perpendicular to the mounting substrate can be reduced and stress brought about by such factors as warping of the wiring substrate during mounting can be flexibly accommodated.

In addition, the obverse and reverse surfaces of the semiconductor package are insulated excepting the vicinities of the holes, thereby preventing short-circuiting during stacking and mounting Furthermore, provision of a plastic guard ring on the outer edge of the tape film reinforces the strength of the stacked and mounted semiconductor package and allows stable positioning between upper and lower devices.

Moreover, the provision of matching projections and indentations on the upper and lower surfaces of the guard ring which mesh when stacking the semiconductor packages allows secure positioning in the horizontal direction, and in addition, clearly distinguishes the obverse and reverse of the packages, thereby reducing the danger of errors in stacking.

Still further, by first vertically positioning lead-pins for connection on the wiring substrate and then inserting the lead-pins through holes in the semiconductor packages, a plurality of semiconductor packages can be stacked and mounted on the wiring substrate.

Also, by first attaching lead-pins to a cover cap and then passing the lead-pins through the holes in the semiconductor packages by insertion from above, a plurality of semiconductor packages can be stacked and mounted on the wiring substrate.

It is to be understood, however, that although the characteristics and advantages of the present invention have been set forth in the foregoing description, the disclosure.is illustrative only, and changes may be made in the arrangement of the parts within the scope of the appended claims.

What is claimed is:

1. A semiconductor package comprising:

a tape film having a wiring pattern of conductive material formed on a surface of said tape film;

and having a chip electrically connected to one end of said wiring pattern, and having holes provided on the other end of said wiring patten for insertion of leads;

wherein said semiconductor package is electrically connectable with another electrical component by way of said leads;

and also wherein at least a position of obverse and reverse surfaces of the semiconductor package, excepting the holes are insulated.

2. A semiconductor package according to claim 1 wherein the obverse and reverse surfaces of said semiconductor package excepting said holes are insulated.

3. A semiconductor package mounting method wherein a plurality of semiconductor packages are stacked and mounted on a wiring substrate by first vertically positioning lead-pins for connection in a wiring substrate and then inserting said lead-pins through holes of semiconductor packages according to claim 2.

4. A semiconductor package mounting method wherein a plurality of semiconductor packages are stacked and mounted on a wiring substrate by first attaching lead-pins to a cover cap and then passing said lead-pins through holes in semiconductor packages according to claim 2 by insertion from above.

5. A semiconductor package comprising:

a tape film having a wiring pattern of conductive material formed on a surface of said tape film;

and having a chip electrically connected to one end of said wiring pattern and having holes provided on the other end of said pattern for insertion of leads wherein said semiconductor package is electrically connectable with another electrical component by way of said leads; and a guard ring along an outer edge of said tape film to secure positioning and reinforcement of the semiconductor packages during stacking and mounting, said guard ring including portions which mesh when stacking said semiconductor packages.

6. A semiconductor package mounting method wherein a plurality of semiconductor packages are stacked and mounted on a wiring substrate by first vertically positioning lead-pins for connection in a wiring substrate and then inserting said lead-pins through holes of semiconductor packages according to claim 5.

7. A semiconductor package mounting method wherein a plurality of semiconductor packages are stacked and mounted on a wiring substrate by first attaching lead-pins to a cover cap and then passing said lead-pins through holes in semiconductor packages according to claim 5 by insertion from above.

8. A semiconductor package according to claim 5 wherein upper and lower surfaces of said guard ring are provided with projections and indentations that mesh when stacking said semiconductor packages.

9. A semiconductor package mounting method wherein a plurality of semiconductor packages are stacked and mounted on a wiring substrate by first vertically positioning lead-pins for connection in a wiring substrate and then inserting said lead-pins through holes of semiconductor packages according to claim 8.

10. A semiconductor package mounting method wherein a plurality of semiconductor packages are stacked and mounted on a wiring substrate by first attaching lead-pins to a cover cap and then passing said lead-pins through holes in semiconductor packages according to claim 8 by insertion from above.

* * * * *

UNITED STATES PATENT AND TRADEMARK OFFICE
CERTIFICATE OF CORRECTION

PATENT NO. : 5,781,415
DATED : July 14, 1998
INVENTOR(S) : Nobuyuki Itoh

It is certified that error appears in the above-identified patent and that said Letters Patent is hereby corrected as shown below:

Claim 1, Col. 6, line 23, "pattem" should be --pattern--.

Claim 1, Col. 6, line 24, "patten" should be --pattern--.

Claim 1, Col. 6, line 30, insert --,-- (comma) after "holes".

Signed and Sealed this

Twenty-seventh Day of October, 1998

Attest:

BRUCE LEHMAN

*Attesting Officer*     *Commissioner of Patents and Trademarks*